(12) United States Patent
Luo et al.

(10) Patent No.: US 11,889,691 B2
(45) Date of Patent: Jan. 30, 2024

(54) INTEGRATED ASSEMBLIES AND METHODS OF FORMING INTEGRATED ASSEMBLIES

(71) Applicant: Micron Technology, Inc., Boise, ID (US)

(72) Inventors: Shuangqiang Luo, Boise, ID (US); Dong Wang, Singapore (SG); Rui Zhang, Boise, ID (US); Da Xing, Singapore (SG); Xiao Li, Boise, ID (US); Pei Qiong Cheung, Singapore (SG); Xiao Zeng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 17/211,580

(22) Filed: Mar. 24, 2021

(65) Prior Publication Data
US 2022/0310642 A1   Sep. 29, 2022

(51) Int. Cl.
*H10B 43/27*   (2023.01)
*H10B 41/27*   (2023.01)
(Continued)

(52) U.S. Cl.
CPC ............. *H10B 43/27* (2023.02); *H10B 41/27* (2023.02); *H10B 41/40* (2023.02); *H10B 43/40* (2023.02)

(58) Field of Classification Search
CPC ........ H10B 43/27; H10B 41/27; H10B 41/40; H10B 43/40; H10B 43/50; H10B 41/50
See application file for complete search history.

(56) References Cited

U.S. PATENT DOCUMENTS

| | | |
|---|---|---|
| 10,141,326 B1 | 11/2018 | Oh et al. |
| 10,784,273 B2 | 9/2020 | Howder et al. |

(Continued)

FOREIGN PATENT DOCUMENTS

| | | |
|---|---|---|
| WO | WO 2020/149911 | 7/2020 |
| WO | WO PCT/US2022/015063 | 9/2023 |

OTHER PUBLICATIONS

WO PCT/US2022/015063 Search Rpt., dated May 23, 2022, Micron Technology, Inc.

(Continued)

*Primary Examiner* — Jay C Kim
*Assistant Examiner* — Woo K Lee
(74) *Attorney, Agent, or Firm* — Wells St. John P.S.

(57) ABSTRACT

Some embodiments include an assembly having conductive structures distributed along a level within a memory array region and another region proximate the memory array region. The conductive structures include a first stack over a metal-containing region. A semiconductor material is within the first stack. A second stack is over the conductive structures, and includes alternating conductive tiers and insulative tiers. Cell-material-pillars are within the memory array region. The cell-material-pillars include channel material. The semiconductor material directly contacts the channel material. Conductive post structures are within the other region. Some of the conductive post structures are dummy structures and have bottom surfaces which are entirely along an insulative oxide material. Others of the conductive post structures are live posts electrically coupled with CMOS circuitry. Some embodiments include methods of forming assemblies.

28 Claims, 19 Drawing Sheets

(51) Int. Cl.
*H10B 41/40* (2023.01)
*H10B 43/40* (2023.01)

(56) References Cited

U.S. PATENT DOCUMENTS

| | | |
|---|---|---|
| 2019/0081061 A1 | 3/2019 | Tessariol et al. |
| 2019/0280003 A1* | 9/2019 | Mushiga ................ H10B 43/10 |
| 2020/0373237 A1 | 11/2020 | Nakajima et al. |
| 2020/0373316 A1 | 11/2020 | Luo et al. |
| 2021/0082941 A1 | 3/2021 | Son et al. |

OTHER PUBLICATIONS

WO PCT/US2022/015063 Writ. Opin., dated May 23, 2022, Micron Technology, Inc.
Hopkins et al., U.S. Appl. No. 17/162,269 titled "Integrated Assemblies and Methods of Forming Integrated Assemblies", filed Jan. 29, 2021, 65 pages.

* cited by examiner

INTEGRATED ASSEMBLIES AND METHODS OF FORMING INTEGRATED ASSEMBLIES

TECHNICAL FIELD

Integrated assemblies (e.g., NAND assemblies) having conductive posts extending through stacks of alternating materials (e.g., alternating levels of wordline material and insulative material). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select-device (e.g., source-side select gate, SGS) 210 and a drain-select device (e.g., drain-side select gate, SGD) 212. Each source-select-device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select-device 210 is connected to a common source line 216. The drain of each source-select-device 210 is connected to the source of the first charge-storage transistor 208 of the corresponding NAND string 206. For example, the drain of source-select-device $210_1$ is connected to the source of charge-storage transistor $208_1$ of the corresponding NAND string $206_1$. The source-select-devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Gating structures of transistors may be utilized to provide gate-induced drain leakage (GIDL) which generates the holes utilized for block-erase of the memory cells. The transistors may be the source-side select (SGS) devices described above. The channel material associated with a string of memory cells may be configured as a channel material pillar, and a region of such pillar may be gatedly coupled with an SGS device. The gatedly coupled portion of the channel material pillar is a portion that overlaps a gate of the SGS device.

It can be desired that at least some of the gatedly coupled portion of the channel material pillar be heavily doped. In some applications it can be desired that the gatedly coupled portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{22}$ atoms/cm$^3$ of dopant.

The channel material may be initially doped to the lightly-doped level, and then the heavily-doped region may be formed by out-diffusion from an underlying doped-semiconductor-material.

It is desired to develop improved methods of forming integrated memory (e.g., NAND memory). It is also desired to develop improved memory devices.

DETAILED DESCRIPTION OF THE ILLUSTRATED EMBODIMENTS

Some embodiments include methods of forming conductive posts within integrated assemblies. One or more of the conductive posts may be "live" posts utilized, for example, for coupling circuitry with CMOS under the posts. Alternatively, one or more of the conductive posts may be "dummy" posts utilized solely for structural support. Some embodiments include integrated assemblies (e.g., assemblies comprising memory arrays suitable for utilization in NAND applications). Example embodiments are described with reference to FIGS. 5-19.

Figure 1:
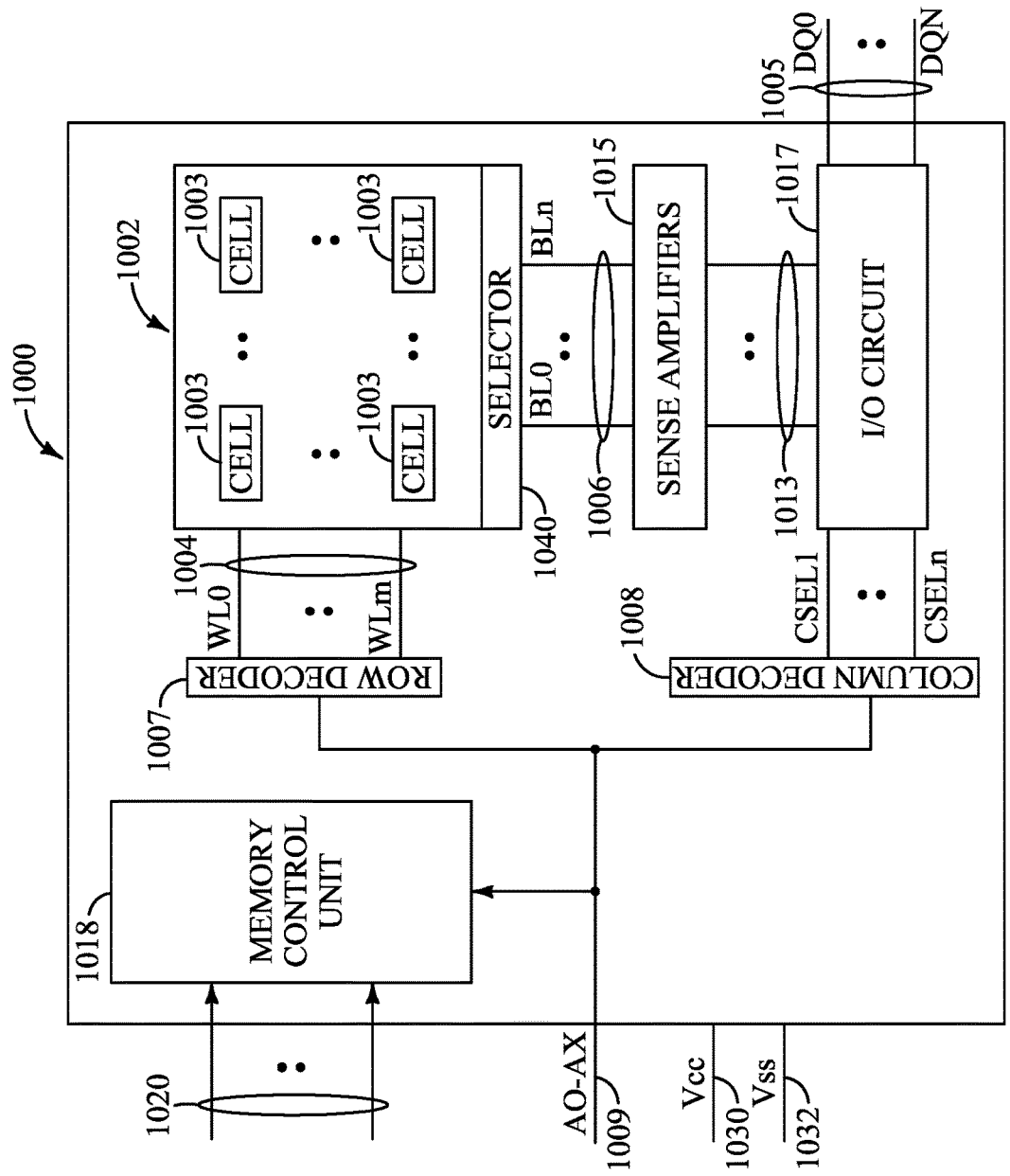
FIG. 1 shows a block diagram of a prior art memory device having a memory array with memory cells.
Figure 2:
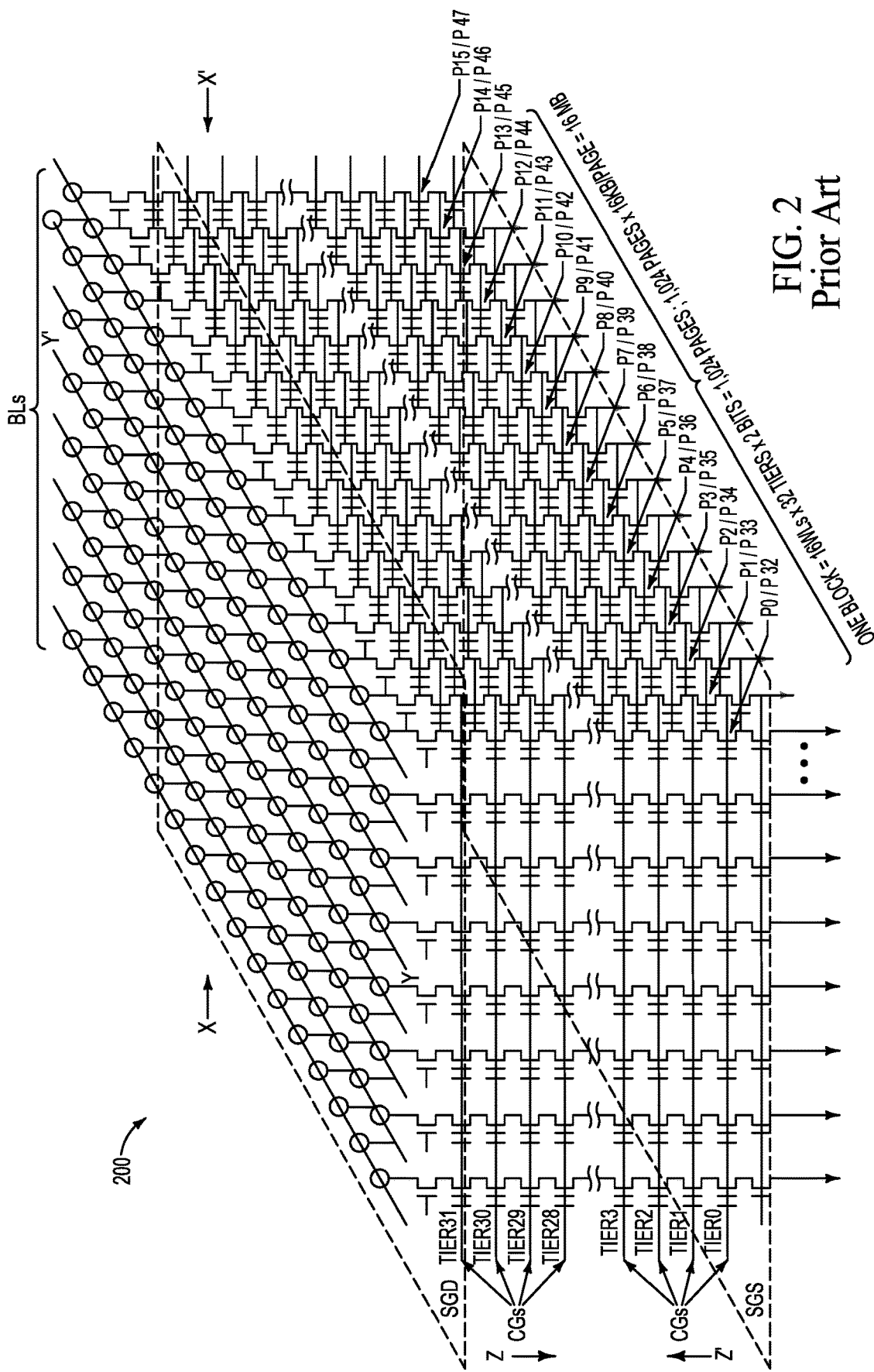
FIG. 2 shows a schematic diagram of the prior art memory array of FIG. 1 in the form of a 3D NAND memory device.
Figure 3:
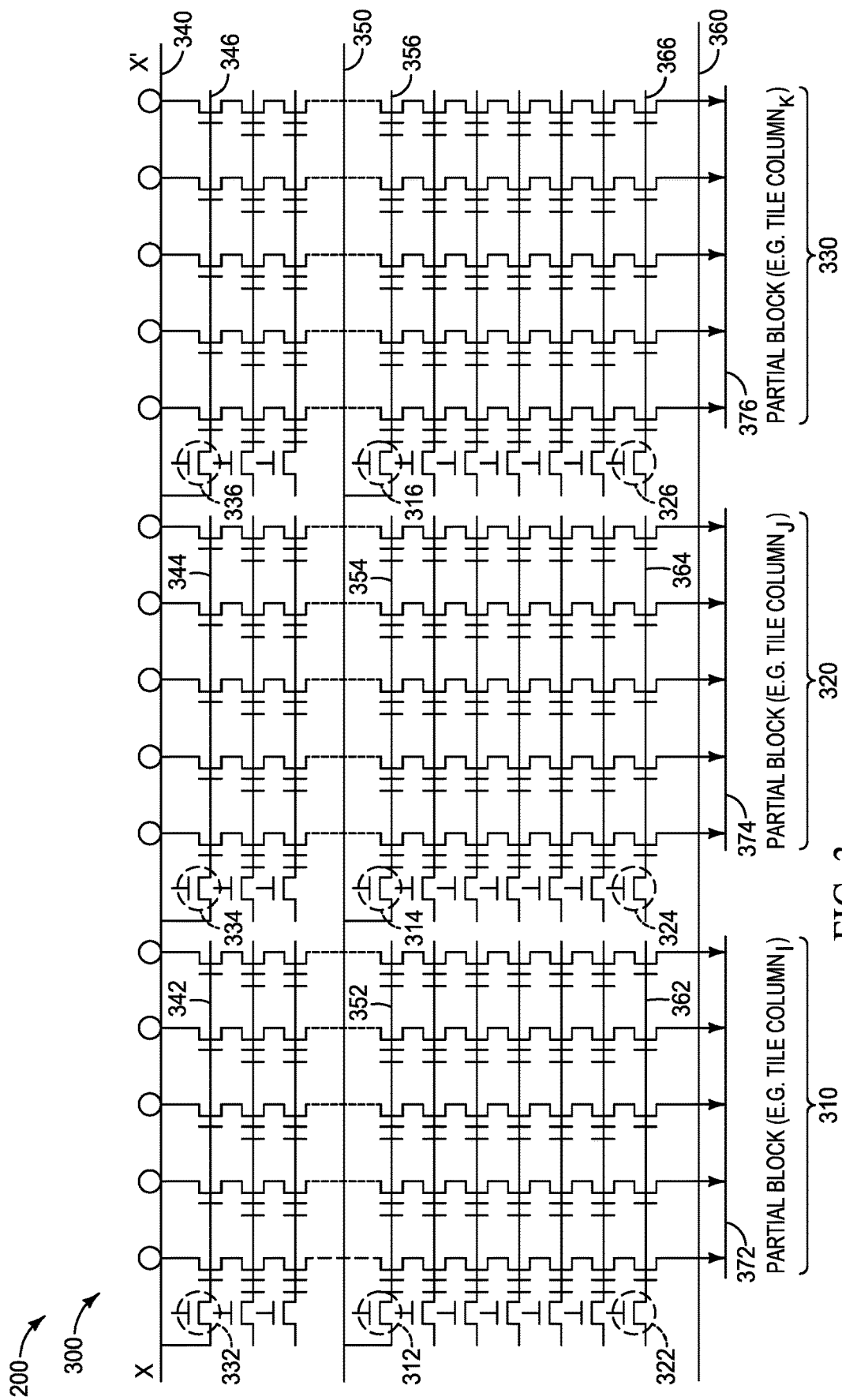
FIG. 3 shows a cross-sectional view of the prior art 3D NAND memory device of FIG. 2 in an X-X' direction.
Figure 4:
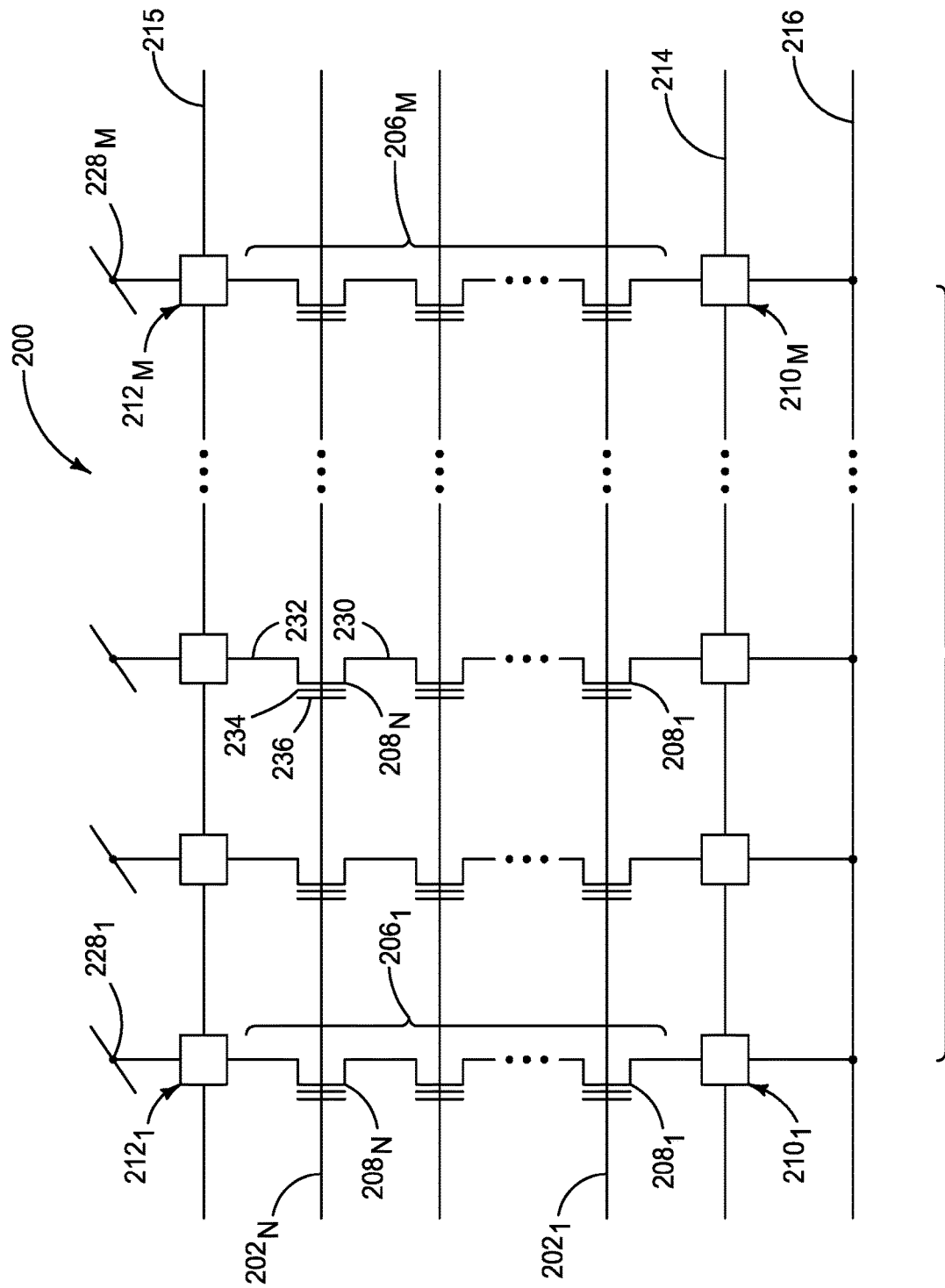
FIG. 4 is a schematic diagram of a prior art NAND memory array.
Figure 5:
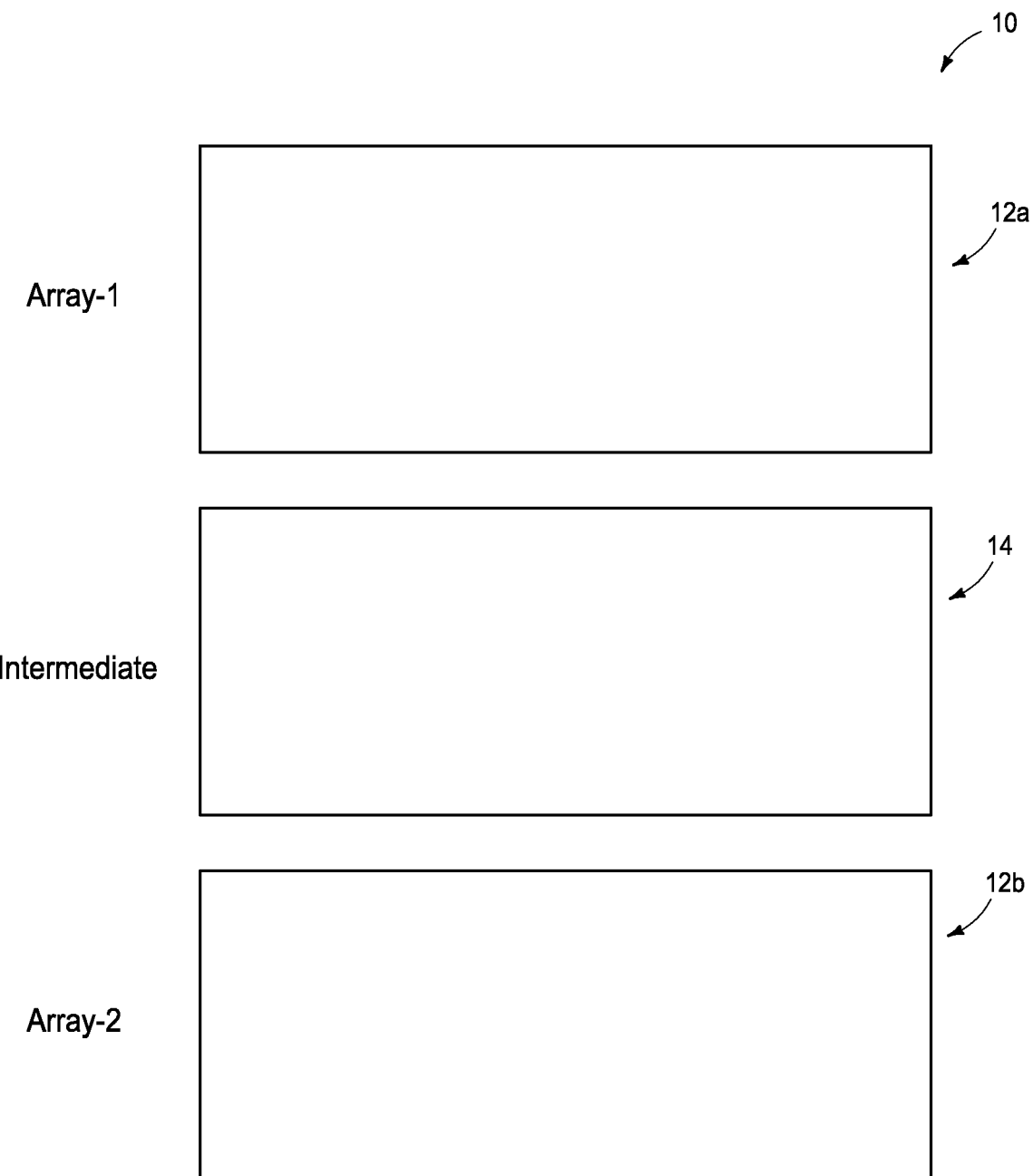
FIG. 5 is a diagrammatic top-down view showing example regions of an example memory device.

FIG. 5 shows a top-down view along several example regions of an example integrated assembly 10. The illustrated regions of the assembly 10 include a pair of memory regions (memory array regions) 12a and 12b (Array-1 and Array-2), and include an intermediate region 14 between the memory regions. In some embodiments, the memory regions 12a and 12b may be referred to as first regions which are laterally displaced relative to one another (laterally offset from one another), and the intermediate region 14 may be referred to as another region (or as a second region) which is between the laterally-displaced (laterally-offset) first regions.

Memory structures (e.g., NAND memory cells) may be formed within the memory array regions 12a and 12b. The memory structures may have associated wordlines, bitlines, SGD devices, SGS devices, etc.

The intermediate region 14 may comprise, for example, staircase regions, crest regions, bridging regions, etc. Conductive posts may be formed within the intermediate region, with some of the conductive posts being utilized solely for support (e.g., being "dummy" structures), and with some of the posts being utilized for providing electrical connection to one or more components associated with the memory structures of the memory array regions (e.g., being "live" structures).

Figure 6:
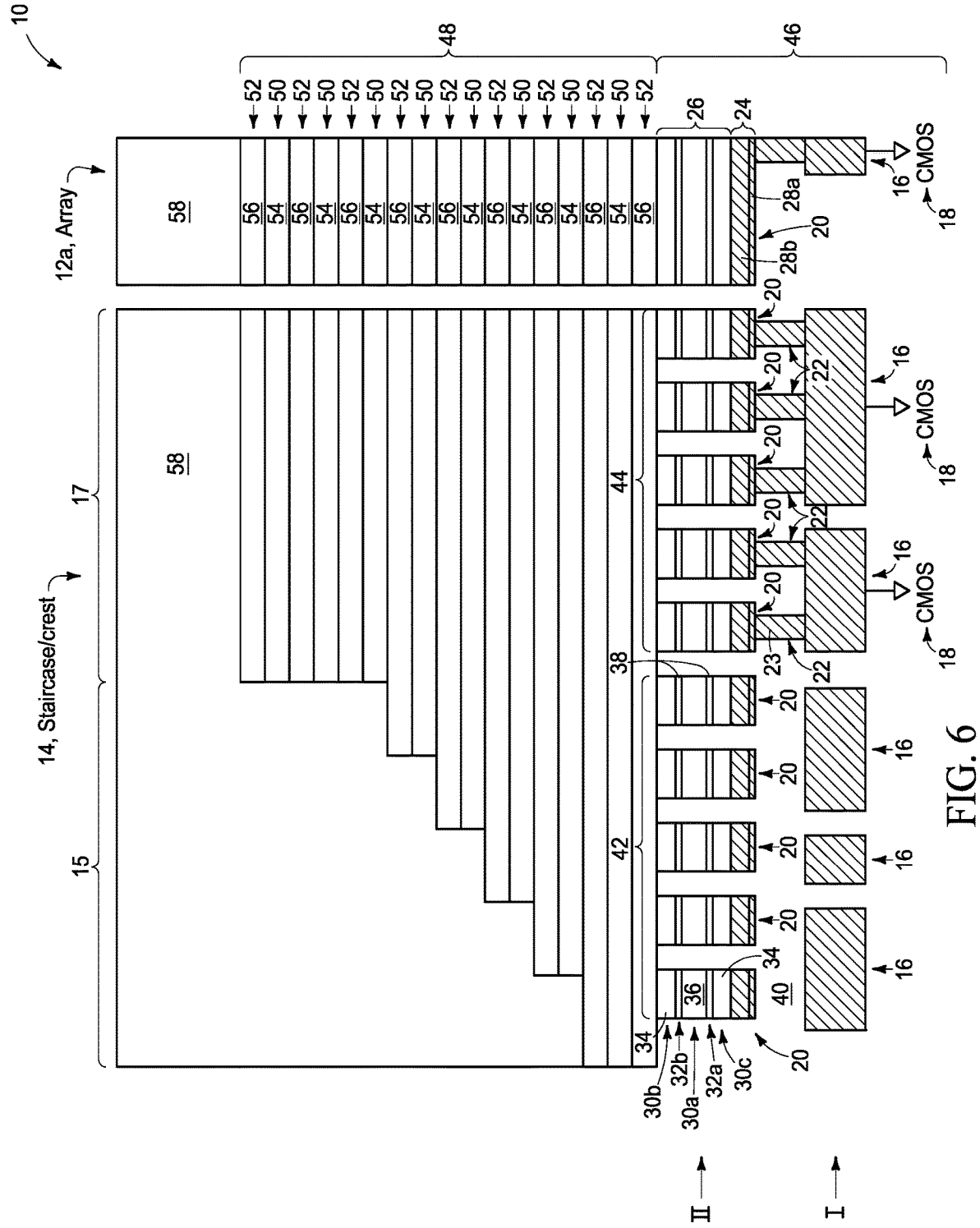
FIGS. 6-15 are diagrammatic cross-sectional side views of a region of an integrated assembly at example sequential process stages of an example method for forming an example memory array.

FIG. 6 shows a diagrammatic cross-sectional side view through portions of the regions 14 and 12a at an example process stage. The region 14 is illustrated to be a "Staircase/crest" region, and is shown to comprise a staircase region 15 adjacent to a crest region 17. The region 12a is illustrated to be an "Array" region.

Conductive blocks 16 are formed along a level I within the regions 12a and 14. Some of the conductive blocks are electrically coupled with CMOS circuitry 18. The CMOS circuitry may comprise control circuitry, sensing circuitry and/or any other suitable circuitry. At least some of the CMOS circuitry may be beneath the level I.

The conductive blocks 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive blocks 16 may comprise, consist essentially of, or consist of tungsten.

The CMOS 18 may be supported by a semiconductor material (not shown). Such semiconductor material may, for example, comprise, consist essentially of, or consist of monocrystalline silicon (Si). The semiconductor material may be referred to as a semiconductor base, or as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The configurations described herein may be referred to as integrated configurations supported by a semiconductor substrate, and accordingly may be considered to be integrated assemblies.

Conductive structures 20 are distributed along a level II within the regions 12a and 14. Some of the conductive structures 20 are coupled with underlying conductive blocks 16 through conductive interconnects 22. The conductive interconnects 22 may comprise any suitable electrically conductive composition(s) 23; such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the composition 23 of the conductive interconnects 22 may comprise, consist essentially of, or consist of tungsten.

The conductive structures 20 include a metal-containing region 24 and a stack 26 over the metal-containing region.

The illustrated metal-containing region 24 includes a pair of metal-containing compositions (i.e., metal-containing materials) 28a and 28b. In some embodiments, the metal-containing composition 28b may comprise tungsten (W) and silicon (Si); and may, for example, comprise, consist essentially of, or consist of WSi, where the chemical formula indicates primary compositions rather than a specific stoichiometry. In some embodiments, the metal-containing composition 28b may be considered to comprise $WSi_x$, where x is a number.

In some embodiments, the metal-containing composition 28a may include one or more of titanium (Ti), tungsten (W) and nitrogen (N); and may, for example, include one or both of TiN and WN, where the chemical formulas indicate primary constituents rather than specific stoichiometries.

The stack 26 includes a central region 30a between two outer regions 30b and 30c. The regions 30b and 30c comprise semiconductor material 34, and the region 30a comprises sacrificial material 36.

The semiconductor material 34 within the regions 30b and 30c may comprise conductively-doped semiconductor material, such as, for example, conductively-doped silicon. In some embodiments, the silicon may be n-type doped, and accordingly may be doped with one or both of phosphorus and arsenic. The conductively-doped silicon of regions 30b and 30c may be doped to a concentration of at least about $10^{22}$ atoms/cm$^3$ with one or more suitable conductivity-enhancing dopant(s). The semiconductor material within the region 30b may be the same as that within the region 30c, as shown, or may be different than that within the region 30c.

The sacrificial material 36 within the region 30a may comprise any suitable composition(s); and in some embodiments may comprise undoped semiconductor material, such as, for example, undoped silicon. The term "undoped" doesn't necessarily mean that there is absolutely no dopant present within the semiconductor material, but rather means that any dopant within such semiconductor material is present to an amount generally understood to be insignificant. For instance, undoped silicon may be understood to comprise a dopant concentration of less than about $10^{16}$ atoms/cm$^3$, less than about $10^{15}$ atoms/cm$^3$, etc., depending on the context. In some embodiments, the material 36 may comprise, consist essentially of, or consist of silicon.

Intervening regions 32 alternate with the regions 30 within the stack 26. A first of the intervening regions is labeled 32a, and is between the central region 30a and the outer region 30c; and a second of the intervening regions is labeled 32b and is between the central region 30a and the outer region 30b.

The regions 32 comprise material 38. The material 38 may be insulative, conductive, etc. In some embodiments, the material 38 may be insulative, and may comprise, consist essentially of, or consist of one or more of silicon dioxide, aluminum oxide, hafnium oxide, silicon nitride, silicon oxynitride, etc. In some embodiments, the material 38 may be conductive, and may comprise one or more metals, metal-containing compositions, etc.

The regions 32a and 32b may comprise the same composition as one another (as shown), or may comprise different compositions relative to one another. One or both of the regions 32a and 32b may comprise a homogeneous composition (as shown) or may comprise a laminate of two or more different compositions.

Although the stack 26 is shown comprising three of the regions 30 and two of the intervening regions 32, it is to be understood that the stack may comprise any suitable number of the regions 30 and 32. In some embodiments, the stack 26 may comprise at least three of the regions 30 and at least two of the intervening regions 32.

The regions 30 may be formed to any suitable thicknesses, and in some embodiments may be formed to thicknesses within a range of from about 100 nanometers (nm) to about 300 nm. The regions 32 may be formed to any suitable thicknesses, and in some embodiments may be formed to thicknesses within a range of from about 5 nm to about 20 nm.

An insulative material 40 is shown to extend over and around the blocks 16, and to extend between the structures 20. The insulative material 40 may comprise any suitable composition(s), and in some embodiments may correspond to an insulative oxide (e.g., may comprise, consist essentially of, or consist of one or more of silicon dioxide, aluminum oxide, hafnium oxide, zirconium oxide, etc.).

Some of the structures 20 within the staircase/crest region 14 are only over the insulative material 40, while others of the structures 20 within the staircase/crest region 14 are over the conductive interconnects 22. The structures 20 which are only over the insulative material 40 may be considered to correspond to structures of one set 42, while the structures 20 which are over the interconnects 22 may be considered to correspond to structures of another set 44. One of the sets 42 and 44 may be referred to as a first set, and the other of such sets may be referred to as a second set.

In some embodiments, the structures 18, 16, 22, 24 and 26, together with the insulative material 40, may be considered to correspond to a construction 46.

The stack 26 may be referred to as a first stack, with such first stack being within the construction 46.

A second stack 48 is formed over the first stack 26. The second stack comprises alternating first and second tiers 50 and 52, respectively. The first tiers 50 comprise sacrificial material 54, and the second tiers 52 comprise insulative material 56. The stack 48 may comprise any suitable number of the tiers 50 and 52, and may, for example, comprise at least 20 of such tiers, at least 40 of such tiers, at least 100 of such tiers, at least 200 of such tiers, etc.

The sacrificial material 54 may be referred to as a second sacrificial material to distinguish it from the first sacrificial material 36. The second sacrificial material 54 may comprise any suitable composition(s), and in some embodiments may comprise, consist essentially of, or consist of silicon nitride.

The insulative material 56 may comprise any suitable composition(s), and in some embodiments may comprise, consist essentially of, or consist of silicon dioxide.

An insulative material 58 is formed over the stack 48. The insulative material 58 may comprise any suitable composition(s), and in some embodiments may comprise, consist essentially of, or consist of silicon dioxide. Accordingly, the insulative materials 58 and 56 may comprise the same composition as one another in some embodiments.

Figure 7:
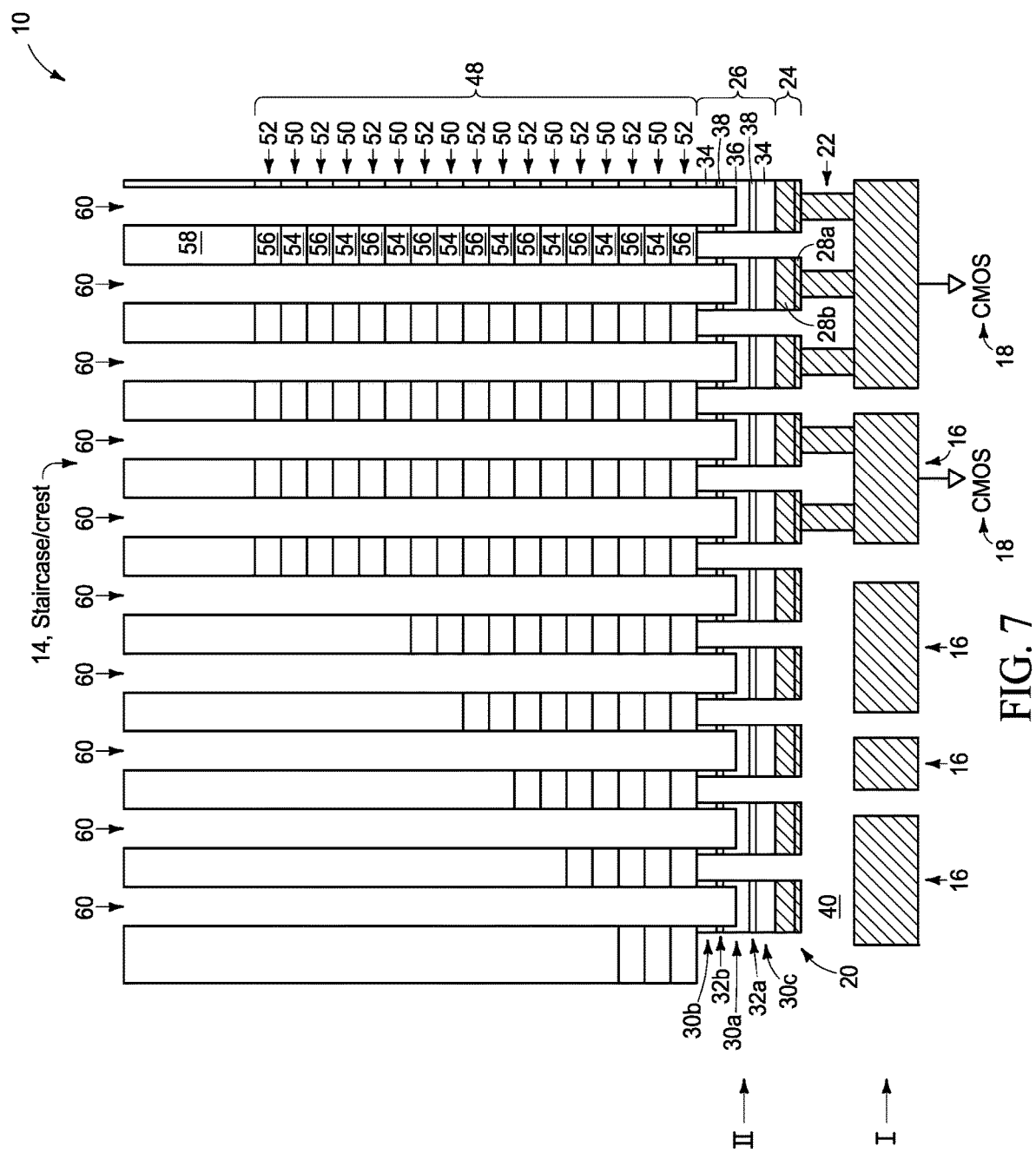

Referring to FIG. 7, openings 60 are formed to extend through the second stack 48 and into the structures 20. The array region 12a (FIG. 6) is not shown in FIG. 7 and instead only the staircase/crest region 14 is shown in order to simplify the drawing.

The openings 60 are shown to project downwardly into the sacrificial material 36 of the structures 20 (i.e., are shown to extend into the central regions 30a of such structures). In other embodiments, the openings 60 may extend to a different depth within the structures 20. For instance, the openings 60 may only extend into the upper regions 30b of such structures, may extend into the lower regions 30c of such structures, etc.

The openings 60 may be formed with any suitable processing. For instance a patterned mask (not shown) may be utilized to define locations of the openings, the openings may be extended into such locations with one or more suitable etches, and then the mask may be removed to leave the illustrated configuration of FIG. 7.

The openings 60 may have any suitable close shapes when viewed from above, and may, for example, have elliptical shapes, square shapes, rectangular shapes, circular shapes, etc.

Although the vertically-extending openings 60 are shown to have straight sidewalls along the materials 54 and 56 of the second stack 48, it is to be understood that in other embodiments the openings may have other configurations. For instance, the sidewalls may be tapered. Additionally, or alternatively, the sidewalls may project into the sacrificial material 54 (e.g., silicon nitride) to form laterally-projecting (horizontally-projecting) cavities along the vertically-extending openings.

Figure 8:
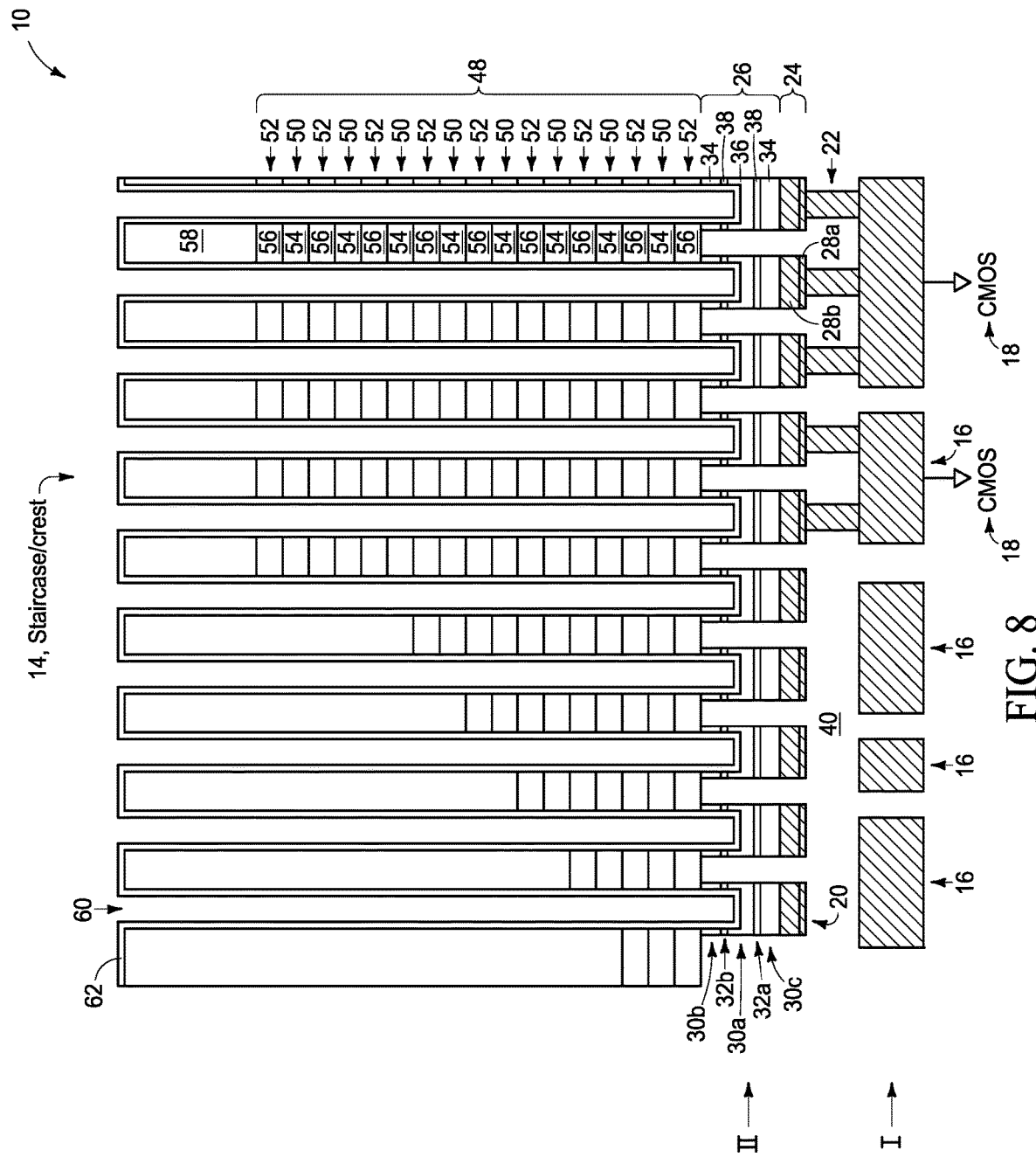

Referring to FIG. 8, insulative material 62 is formed within the openings 60 to line the openings. The insulative material 62 may be referred to as a second insulative material to distinguish it from the first insulative material 56 within the stack 48.

The insulative material 62 may comprise any suitable composition(s), and in some embodiments may comprise, consist essentially of, or consist of one or more of silicon dioxide, aluminum oxide, hafnium oxide, zirconium oxide, etc.

Figure 9:
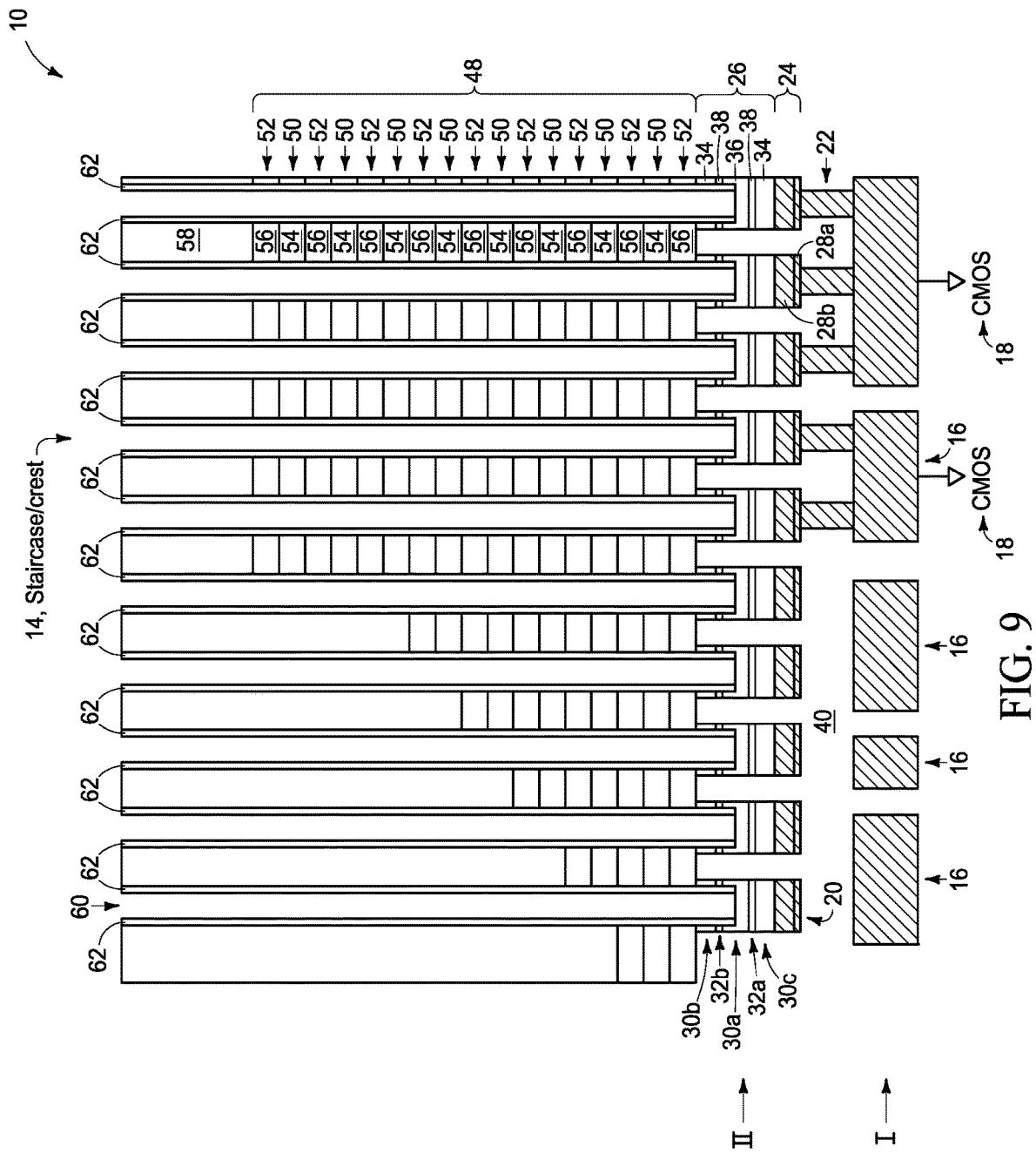

Referring to FIG. 9, the insulative material 62 is subjected to anisotropic etching to remove the material from along bottoms of the openings 60, while leaving the material along sidewalls of the openings as liners.

Figure 10:
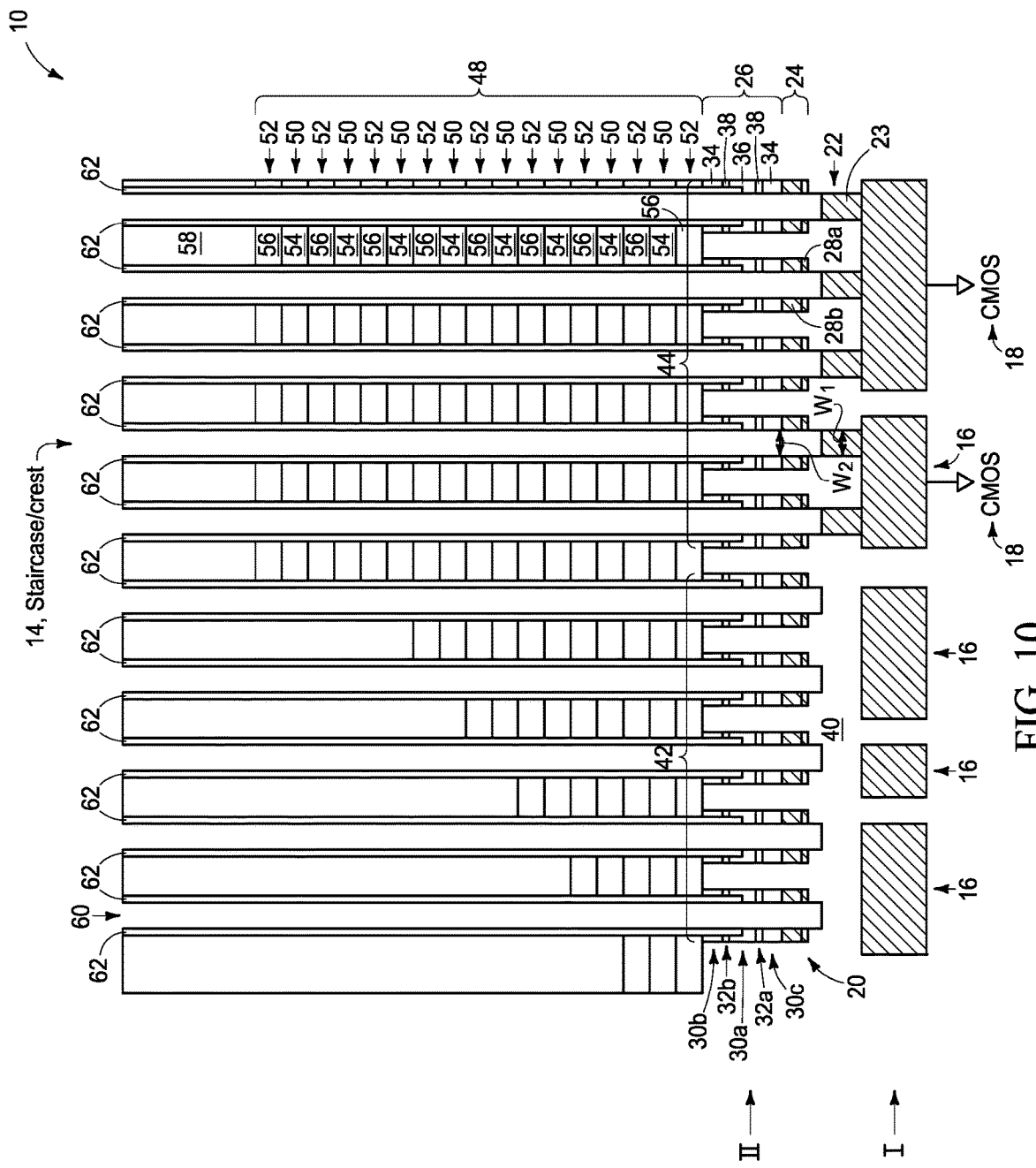

Referring to FIG. 10, the openings 60 are extended through the structures 20 with one or more suitable etches. In some embodiments, the etching of FIG. 10 may be considered to correspond to punching through the bottoms of the lined openings 60. The etching conditions may be chosen to slow, or even stop, upon reaching the insulative material 40 and upon reaching the conductive material of the metal-containing interconnects 22. In the illustrated embodiment, the etching conditions have penetrated to a minor extent into the insulative material 40, and to minor extent into the conductive material 23 of the interconnects 22. The etching conditions may utilize one or more halides (e.g., may utilize one or more of chlorine, bromine and fluorine), and in some embodiments may utilize one or more of $CF_4$, $CHF_3$, HBr and $SiCl_4$.

In the illustrated embodiment of FIG. 10, the interconnects 22 comprise a first lateral width $W_1$ along the illustrated cross-section of the figure, and the openings 60 comprise a second lateral width $W_2$ along such illustrated cross-section, with the second lateral width being about the same as the first lateral width (e.g., being the same to within reasonable tolerances of fabrication and measurement). In other embodiments, the openings 60 may have a lateral width different than the lateral width of the interconnects 22. For instance the openings 60 may be wider than the interconnects 22 (which may advantageously provide additional tolerances for potential mask misalignment). An example embodiment in which the openings 60 are wider than the interconnects 22 is described below with reference to FIGS. 16-18.

Referring still to FIG. 10, the openings 60 may be considered to penetrate through the structures 20 of the set 42 to the insulative oxide 40, and to penetrate through the structures 20 of the set 44 to the metal-containing material 23 of the interconnects 22.

Figure 11:
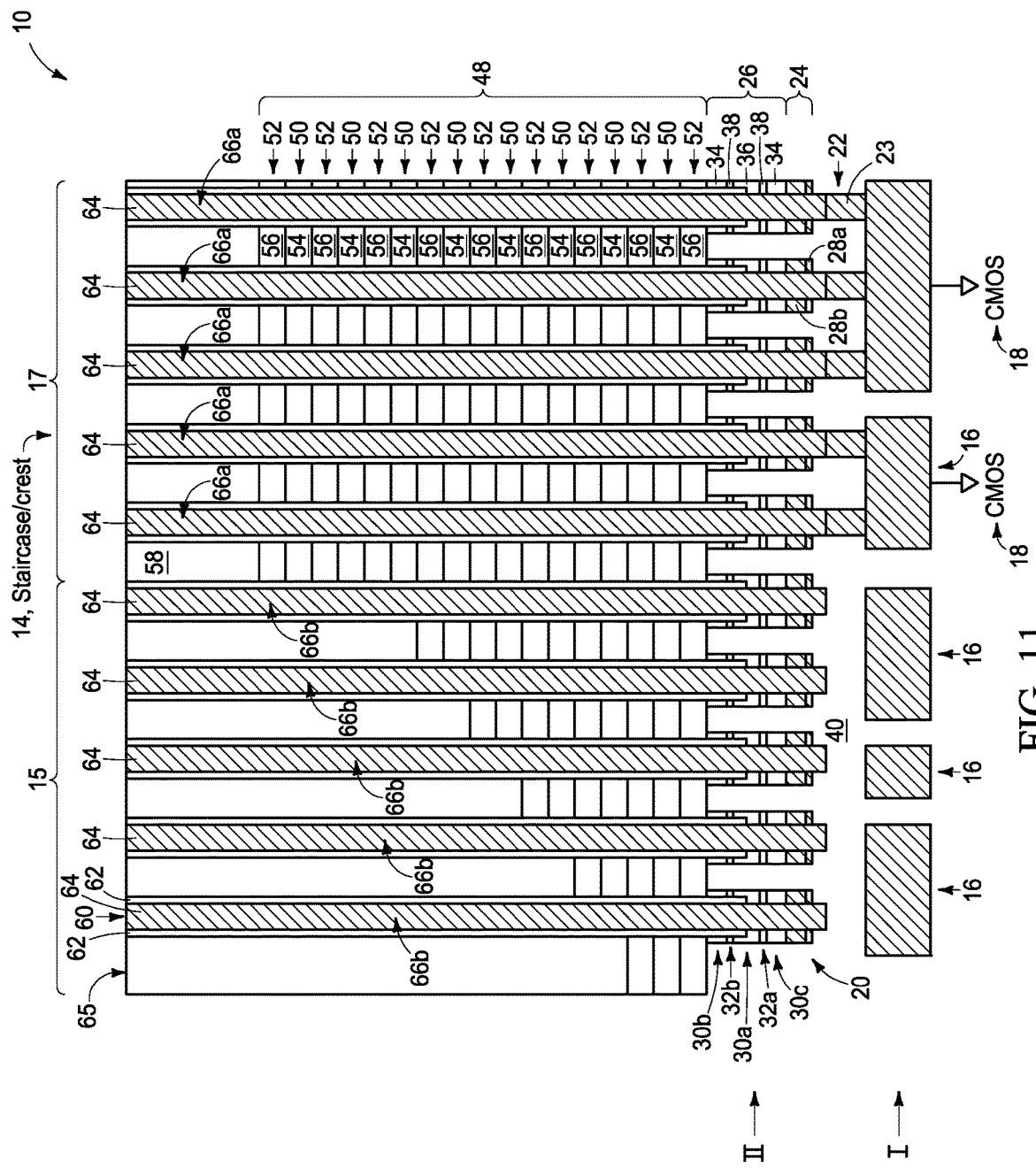

Referring to FIG. 11, conductive post material 64 is formed within the openings 60. The conductive post material is patterned into conductive posts 66. Some of the posts 66 are live posts 66a which are coupled to the CMOS 18 through the interconnects 22, and others are dummy posts 66b. In the illustrated embodiment, the live posts are within the crest region 17, and the dummy posts are within the staircase region 15. In other embodiments, one or more dummy posts may be within the crest region and/or one or more live posts may be within the staircase region.

The conductive post material 64 may comprise a same composition as the metal-containing material 23 of the interconnects 22. For instance, in some embodiments the conductive post material 64 and the metal-containing material 23 may both comprise, consist essentially of, or consist of tungsten. The utilization of the same material for the conductive post material 64 and the metal-containing material 23 may reduce resistance along an interface between the conductive post material and the metal-containing material as compared to structures in which the conductive post material is directly against a material having a different composition than the conductive post material.

A planarized surface 65 is formed to extend across the materials 58, 62 and 64. The planarized surface 65 may be formed with any suitable processing, such as, for example, chemical-mechanical polishing (CMP).

Figure 12:
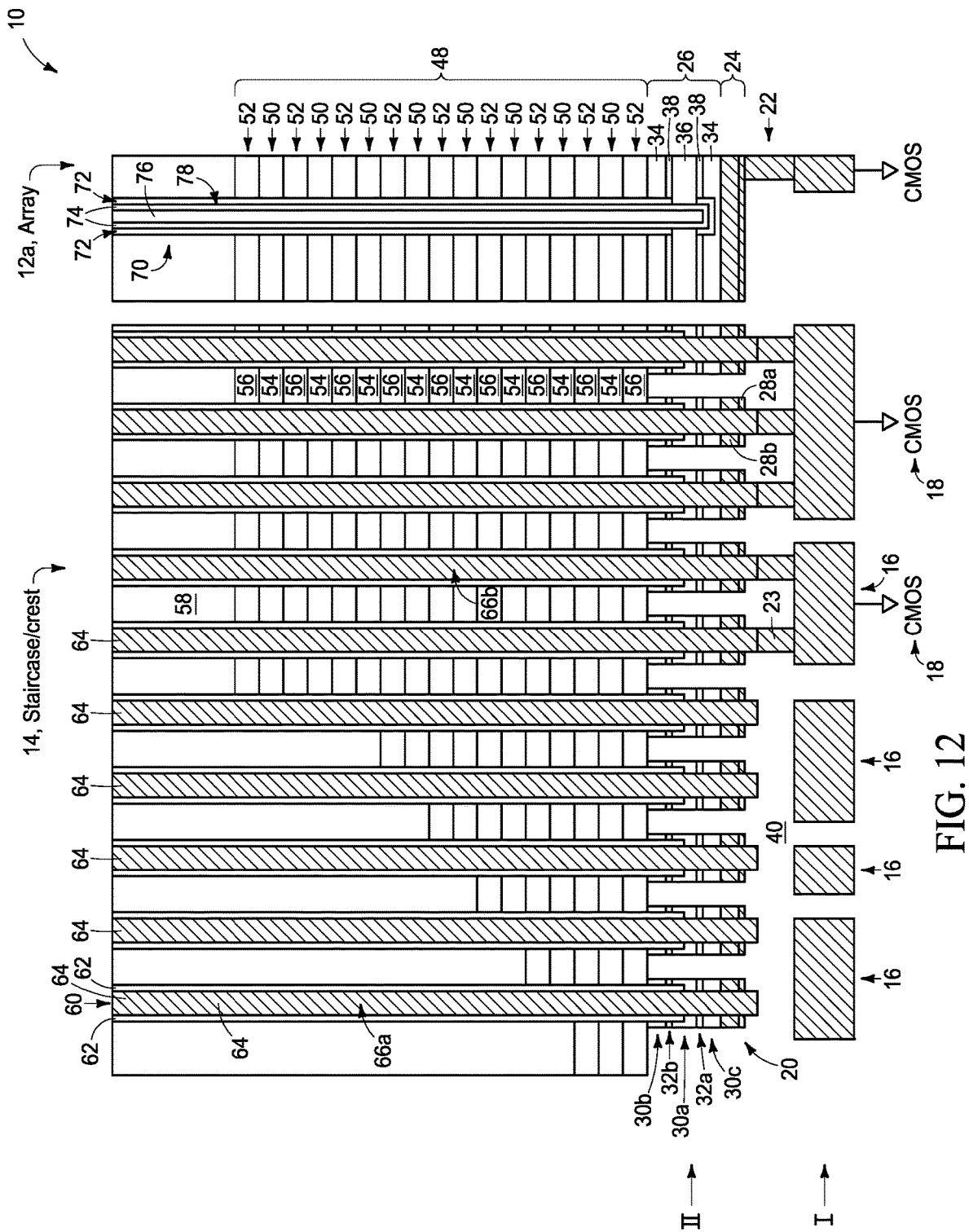

Referring to FIG. 12, a cell-material-pillar 70 is formed within the memory region 12a. The pillar 70 may be representative of a large number of cell-material-pillars which are formed within the memory regions 12a and 12b (with such memory regions being shown in FIG. 5). The cell-material-pillars may be substantially identical to one another, with the term "substantially identical" meaning identical to within reasonable tolerances of fabrication and measurement. The pillars 70 may be configured in a tightly-packed arrangement within each of the memory regions 12a and 12b, such as, for example, a hexagonal close packed (HCP) arrangement. There may be hundreds, thousands, hundreds of thousands, millions, etc., of the pillars 70 arranged within each of the memory regions 12a and 12b.

The illustrated pillar 70 of FIG. 12 comprises an outer region 72 containing memory cell materials, a channel material 74 adjacent the outer region 72, and an insulative material 76 laterally surrounded by the channel material 74.

The cell materials within the region 72 may comprise tunneling material, charge-storage material and charge-blocking material. The tunneling material (also referred to as gate dielectric material) may comprise any suitable composition(s); and in some embodiments may comprise one or more of silicon dioxide, aluminum oxide, hafnium oxide, zirconium oxide, etc. The charge-storage material may comprise any suitable composition(s); and in some embodiments may comprise floating gate material (e.g., polysilicon) or charge-trapping material (e.g., one or more of silicon nitride, silicon oxynitride, conductive nanodots, etc.). The charge-blocking material may comprise any suitable composition(s); and in some embodiments may comprise one or more of silicon dioxide, aluminum oxide, hafnium oxide, zirconium oxide, etc.

The channel material 74 comprises semiconductor material. The semiconductor material may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise, consist essentially of, or consist of appropriately-doped silicon.

The channel material 74 may be considered to be configured as a channel-material-pillar 78. In the illustrated embodiment, the channel-material-pillar 78 is configured as an annular ring in top-down view (not shown), with such annular ring surrounding the insulative material 76. Such configuration of the channel-material-pillar may be considered to correspond to a "hollow" channel configuration, with the insulative material 76 being provided within the hollow of the channel-material-pillar. In other embodiments, the channel material 74 may be configured as a solid pillar.

The insulative material 76 may comprise any suitable composition(s), and in some embodiments may comprise, consist essentially of, or consist of silicon dioxide.

Figure 13:
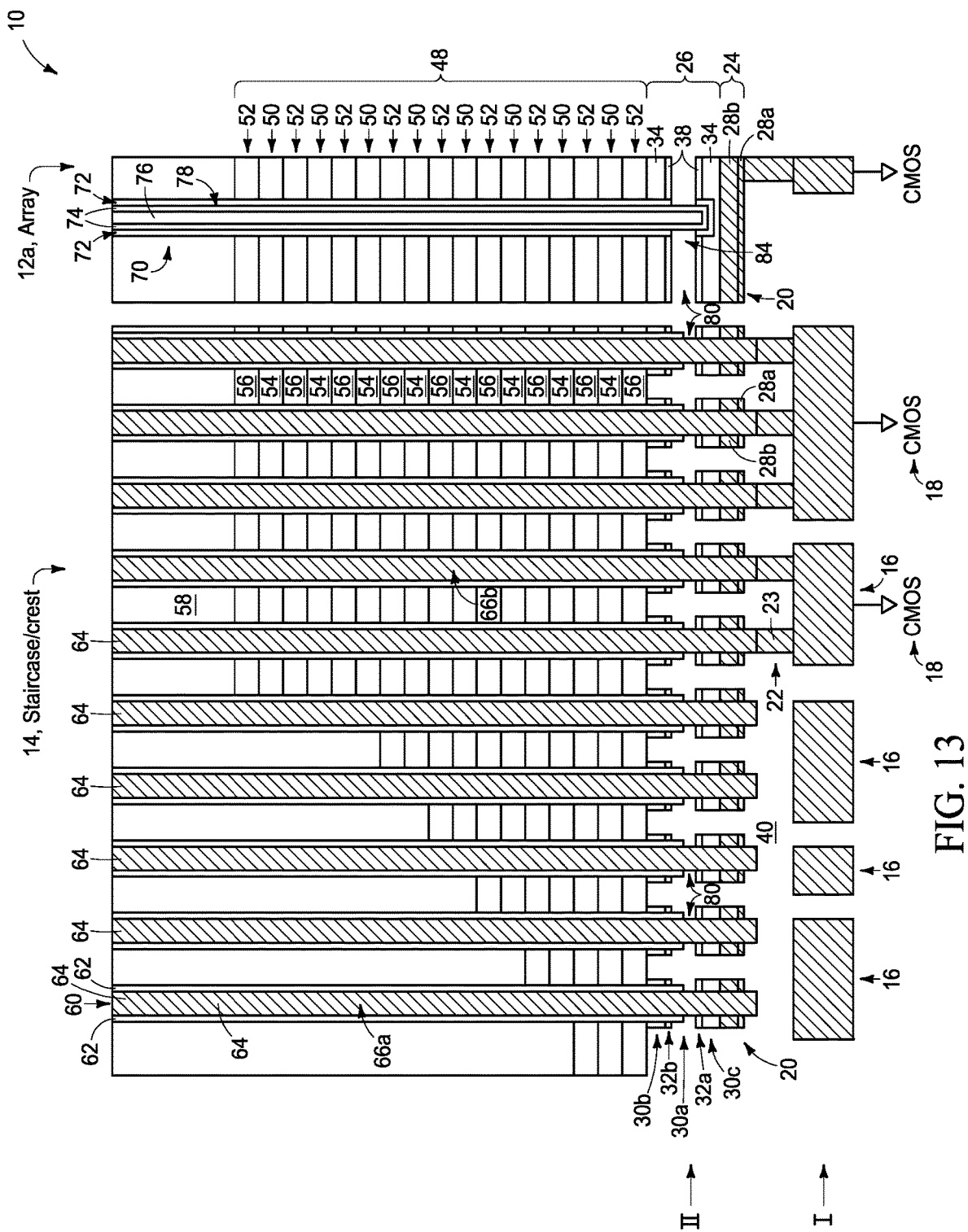

Referring to FIG. 13, the sacrificial material 36 (FIG. 12) is removed to leave voids regions (conduits) 80 within the central region 30a of the stack 26.

The conduits 80 may be formed with any suitable processing, and in some embodiments may be formed utilizing one or more etchants containing hydrofluoric acid. Such etchants may be flowed into one or more slits that are out of the plane of the cross-section of FIG. 13, and that extend through the stack 48 to the sacrificial material 36 (FIG. 12) of the stack 26. In the shown embodiment, the intervening regions 32a and 32b remain after formation of the conduits 80. In other embodiments, such intervening regions may be removed during formation of the conduits, depending on the composition(s) of the intervening regions and of the etchant(s) utilized to remove the sacrificial material 36.

The conduits 80 are also extended through the cell materials of the outer regions 72 to expose sidewall surfaces of the semiconductor material (channel material) 74. Such may or may not be conducted with a different etchant than that utilized to remove the sacrificial material 36.

Figure 14:
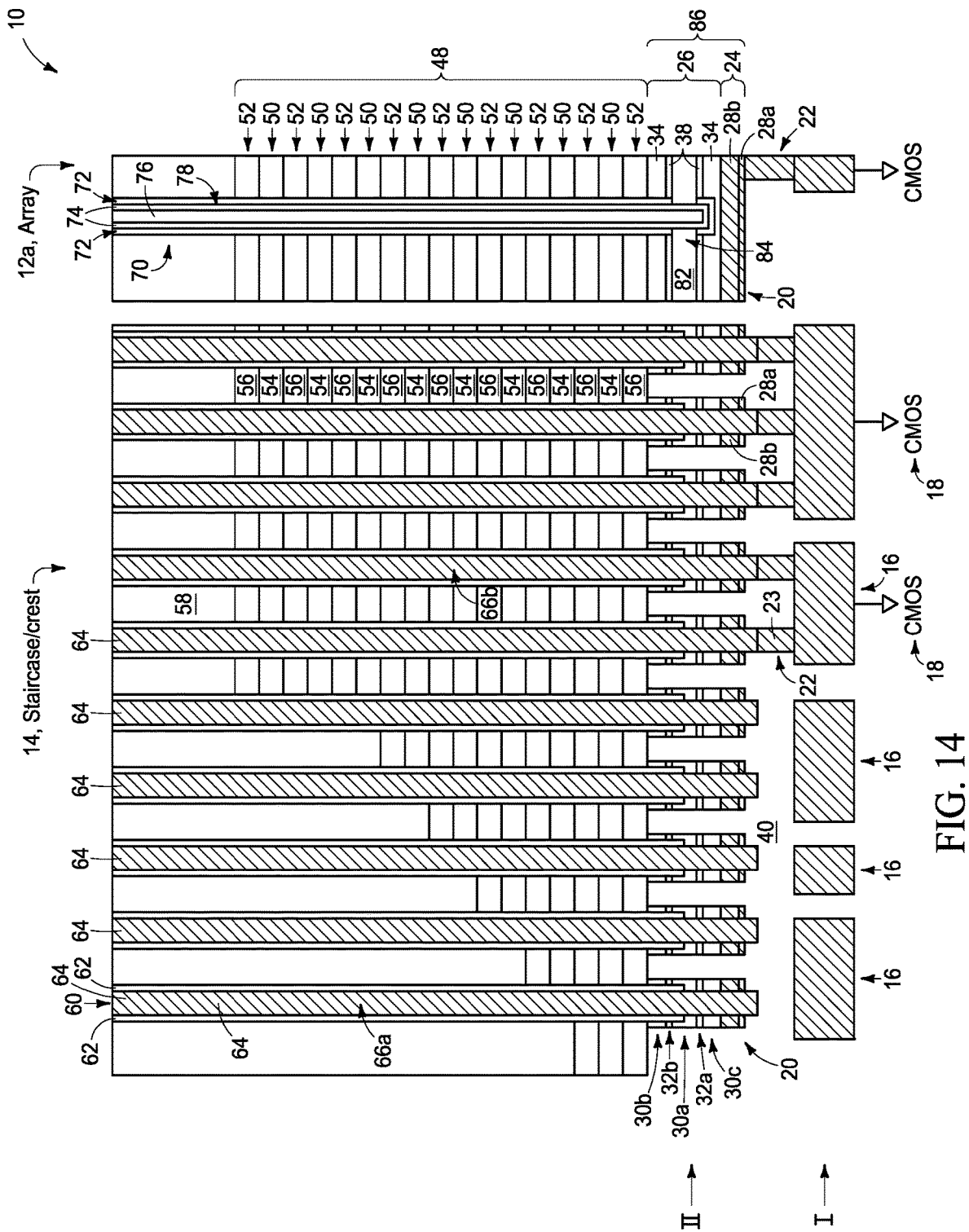

Referring to FIG. 14, conductively-doped-semiconductor-material 82 is formed within the conduits 80 (FIG. 13). The semiconductor material 82 becomes the central region 30a of the stack 26.

The semiconductor material 82 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 82 may comprise silicon which is heavily doped (e.g., doped to a concentration of at least about $10^{22}$ atoms/cm$^3$) with n-type dopant (e.g., phosphorus, arsenic, etc.). The conductive material 82 may be considered to be configured as a source-structure-component 84 which is coupled with the lower region of the channel-material-pillar 78. In some embodiments, the materials within the first stack 26 of FIG. 14 may all be considered to be part of a conductive source structure 86 provided within the memory array region 12a.

The structures 20 within the staircase/crest region 14 may be considered to be conductive structures at the process stage of FIG. 14. Specifically, the primary materials 34 and 82 within the structures 20 may all correspond to conductively-doped semiconductor material (e.g., conductively-doped silicon).

The regions 32a and 32b may be removed during the formation of the conduits 80 of FIG. 13 (as discussed above with reference to FIG. 13) so that such regions are not part of the source structure 86 and the conductive structures 20. In some embodiments, the regions 32a and 32b may be conductive, or may be insulative and kept very thin so that they do not problematically influence electrical conduction along the source structure 86.

The doped-semiconductor-material 82 directly contacts the channel material 74 of the channel-material-pillar 78 in the shown embodiment.

Dopant may be out-diffused from the conductively-doped-semiconductor-material 82 into the semiconductor material (channel material) 74 to form a heavily-doped region within a lower portion of the channel-material-pillar 78. Such heavily-doped region may be advantageously utilized during formation of SGS devices at a subsequent process stage (discussed below with reference to FIG. 15).

The out-diffusion from the doped material 82 into the semiconductor material 74 may be accomplished with any suitable processing, including, for example, suitable thermal processing (e.g., thermal processing at a temperature exceeding about 300° C. for a duration of at least about two minutes).

Figure 15:
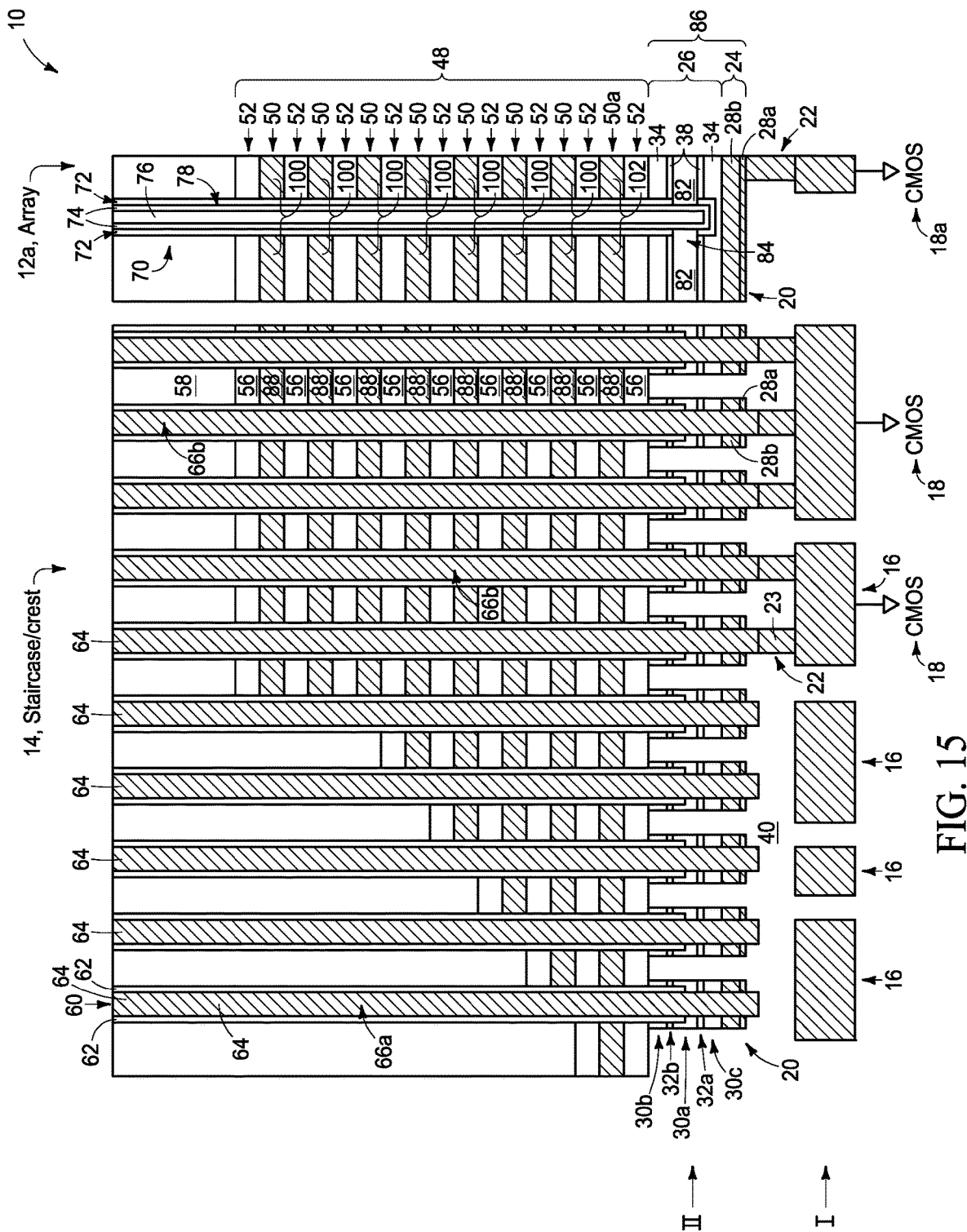

Referring to FIG. 15, the sacrificial material 54 (FIG. 14) of the first tiers 50 is removed and replaced with conductive material 88. Although the conductive material 88 is shown to entirely fill the first tiers 50, in other embodiments at least some of the material provided within the first tiers 50 may be insulative material (e.g., dielectric-barrier material). The dielectric-barrier material may comprise any suitable composition(s); and in some embodiments may comprise one or more of aluminum oxide, hafnium oxide, zirconium oxide, etc.

The conductive material 88 may comprise any suitable composition(s), and in some embodiments may comprise a tungsten core at least partially surrounded by titanium nitride.

The first tiers 50 of FIG. 15 are conductive tiers, and the stack 48 may be considered to comprise alternating insulative tiers 52 and conductive tiers 50.

The assembly 10 of FIG. 15 may be considered to comprise regions of a memory device which includes memory cells 100 and select devices (SGS devices) 102 (with only one or such SGS devices being in shown in FIG. 15). A lowermost of the conductive levels 50 is labeled 50a, and the doped region within the channel material 74 (described above with reference to FIG. 14 as being formed by out-diffusion into the channel material 74) may extend to the conductive level 50a. The conductive level 50a comprises the SGS devices 102. The dopant may extend partially across the level 50a to achieve the desired balance between non-leaky OFF characteristics and leaky GIDL characteristics for the SGS devices.

Although only one of the conductive levels is shown incorporated into the SGS devices, in other embodiments multiple conductive levels may be incorporated into the SGS devices. The conductive levels may be electrically coupled with one another (ganged together) to be incorporated into long-channel SGS devices. If multiple of the conductive levels are incorporated into the SGS devices, the out-diffused dopant may extend upwardly across two or more of the conductive levels 50 which are incorporated into the SGS devices.

The memory cells 100 (e.g., NAND memory cells) are vertically-stacked one atop another. Each of the memory cells comprises a region of the semiconductor material (channel material) 74, and comprises regions (control gate regions) of the conductive levels 50. The regions of the conductive levels 50 which are not comprised by the memory cells 100 may be considered to be wordline regions (routing regions) which couple the control gate regions with driver circuitry and/or with other suitable circuitry. The memory cells 100 comprise the cell materials (e.g., the tunneling material, charge-storage material and charge-blocking material) within the regions 72.

In some embodiments, the conductive levels 50 associated with the memory cells 100 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The wordline levels (NAND wordline levels) 50 may be coupled to control circuitry (e.g., wordline driver circuitry) with interconnects (not shown) formed in the staircase region to couple to individual wordline levels.

The source structure 86 may be analogous to the source structures 216 described in the "Background" section. The source structure is shown to be coupled with control circuitry (e.g., CMOS) 18a, as shown. The control circuitry may be under the source structure (as shown), or may be in any other suitable location. The source structure may be coupled with the control circuitry 18a at any suitable process stage.

Figure 16:
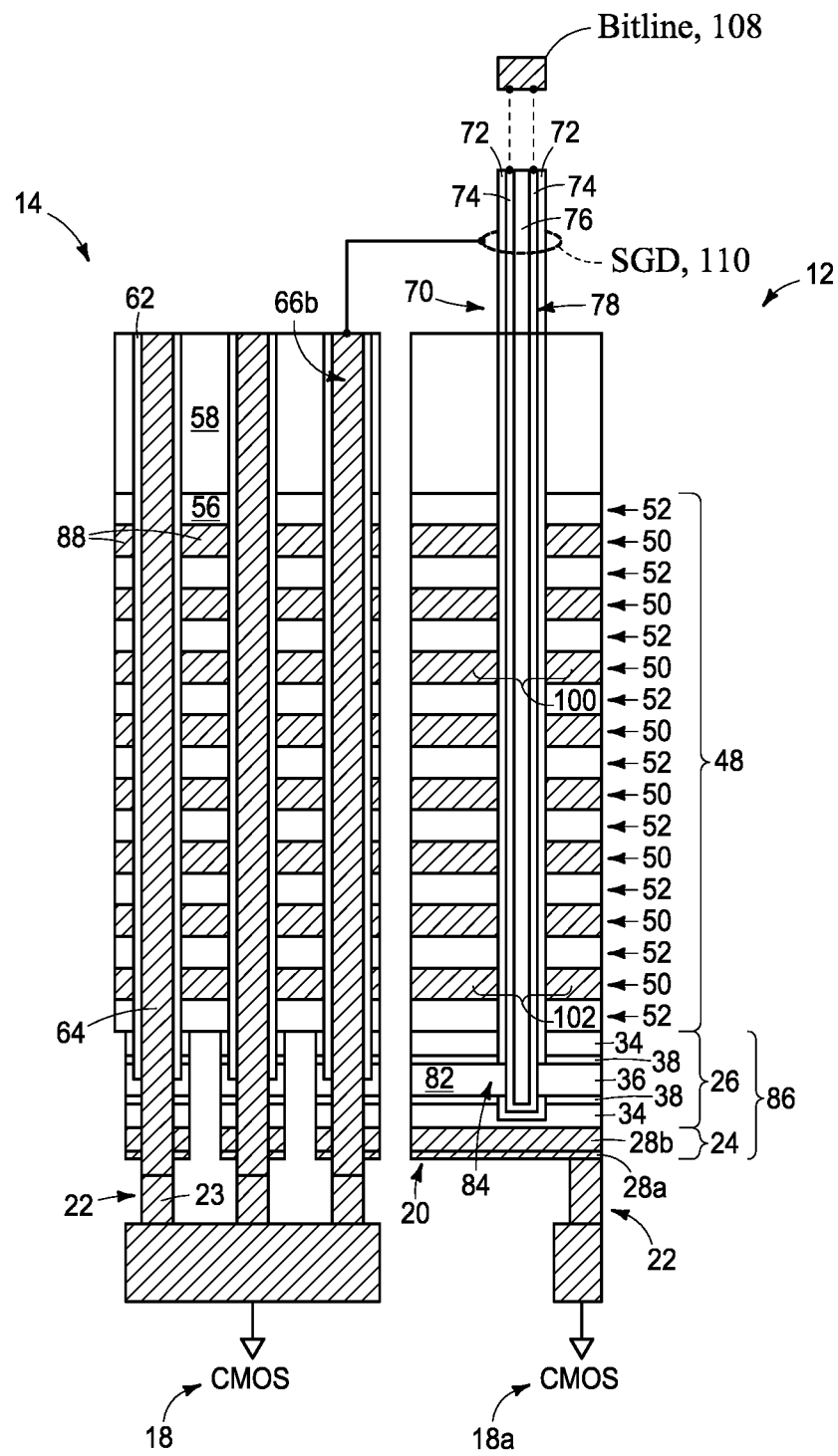
FIG. 16 is a diagrammatic cross-sectional side view of a region of the example integrated assembly of FIG. 15, and shows an additional vertically-extended portion of such assembly.

FIG. 16 shows the configuration of FIG. 15, and shows the cell-material-pillar 70 vertically-extended and coupled with a bitline 108. An SGD device 110 is diagrammatically illustrated as being adjacent to the upper region of the pillar 70, and to be beneath the bitline 108.

The bitline 108 may extend in and out of the page relative to the cross-sectional view of FIG. 16.

The pillar 70, bitline 108, SGD device 110, SGS device 102 and memory cells 100 may be together considered to form a NAND-type configuration analogous to those described above with reference to FIGS. 1-4.

The SGD device 110 is indicated to be coupled to one of the conductive posts 66*b* in the view of FIG. 16. Accordingly, in some embodiments SGD devices 110 associated with the memory region 12*a* may be coupled to the CMOS (e.g., logic circuitry) 18 through the conductive posts 66*b* associated with the intermediate region 14.

The SGD devices 110 are examples of components that may be associated with the cell-material-pillars 70 and coupled with the CMOS 18 through the conductive posts 66. In other embodiments, other components may be coupled to the CMOS through one or more of the conductive posts 66, either in addition to, or alternatively to, the SGD devices 110. For instance, the bitlines may be coupled to the CMOS through the conductive posts 66, and in such embodiments the CMOS may include sensing circuitry (e.g., sense-amplifier-circuitry) coupled to the bitlines through the conductive posts 66. Generally, one or more components may be operatively proximate to the cell-material-pillars 70 (and/or the channel-material-pillars 78), and may be coupled to the CMOS 18 through the conductive posts 66 (and specifically through the live conductive posts 66*b*).

As discussed above with reference to FIG. 10, in some embodiments the lined openings 60 may be formed to be larger than the interconnects 22. Such may be advantageous in that it may enable increased tolerance for mask misalignment that may occur during the aligning of the openings 60 to the interconnects 22. An example method of forming and utilizing lined openings which are larger than underlying interconnects is described with reference to FIGS. 17-19.

Figure 17:
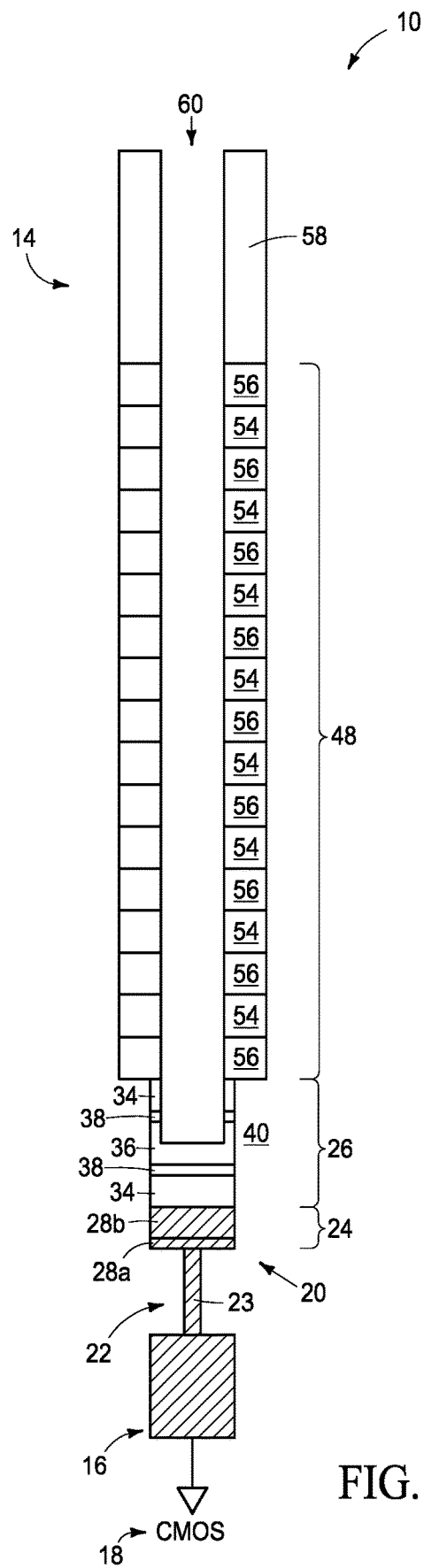
FIGS. 17-19 are diagrammatic cross-sectional side views of a region of an example integrated assembly at example sequential process stages of an example method. The process stage of FIG. 17 may follow that of FIG. 6.

Referring to FIG. 17, a region of the assembly 10 is shown at a process stage analogous to that described above with reference to FIG. 7. However, the opening 60 has a much larger width along the cross-section of FIG. 17 than does the interconnect 22.

Figure 18:
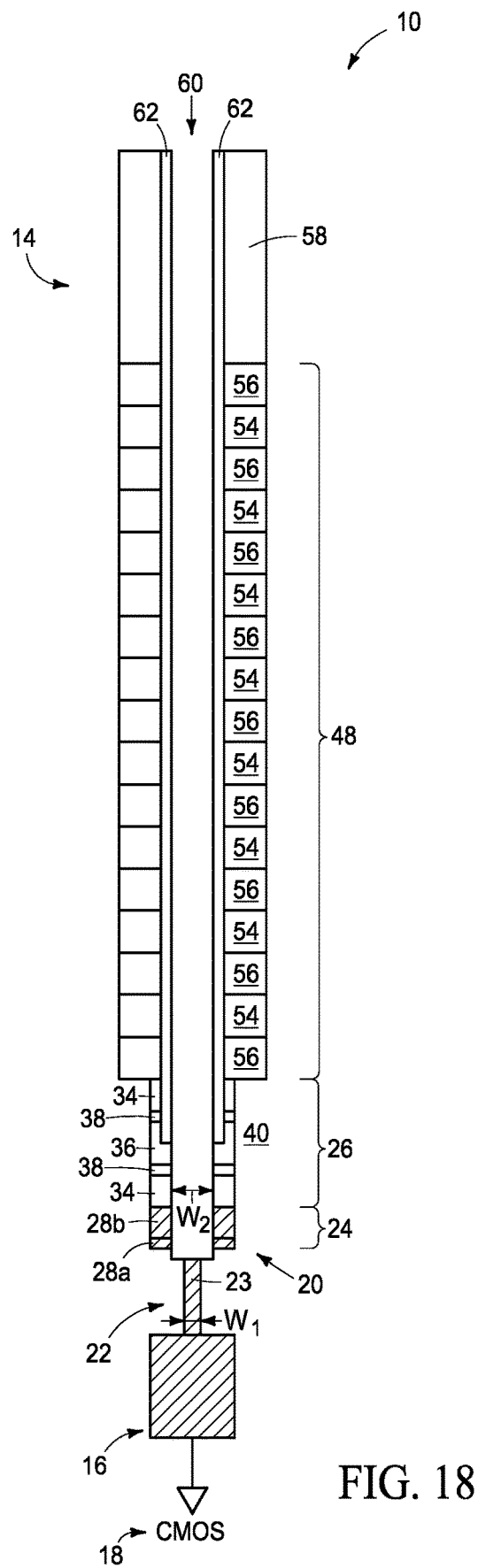

Referring to FIG. 18, the assembly 10 is shown at a process stage analogous to that of FIG. 10. The insulative material 62 is provided within the opening 60 to line the opening, and then the opening is extended through the structure 20 to the interconnect 22. Since the etch utilized to punch through the structure 20 will stop, or at least slow down, upon reaching the metal-containing material 23 and the insulative oxide 40, the etch controllably exposes an upper surface of the metal-containing material 23 of the interconnect 22 without problematically over-etching around such conductive material.

The configuration of FIG. 18 is similar to that of FIG. 10, except that the width $W_2$ of the opening 60 is larger than the width $W_1$ of the interconnect 22.

Figure 19:
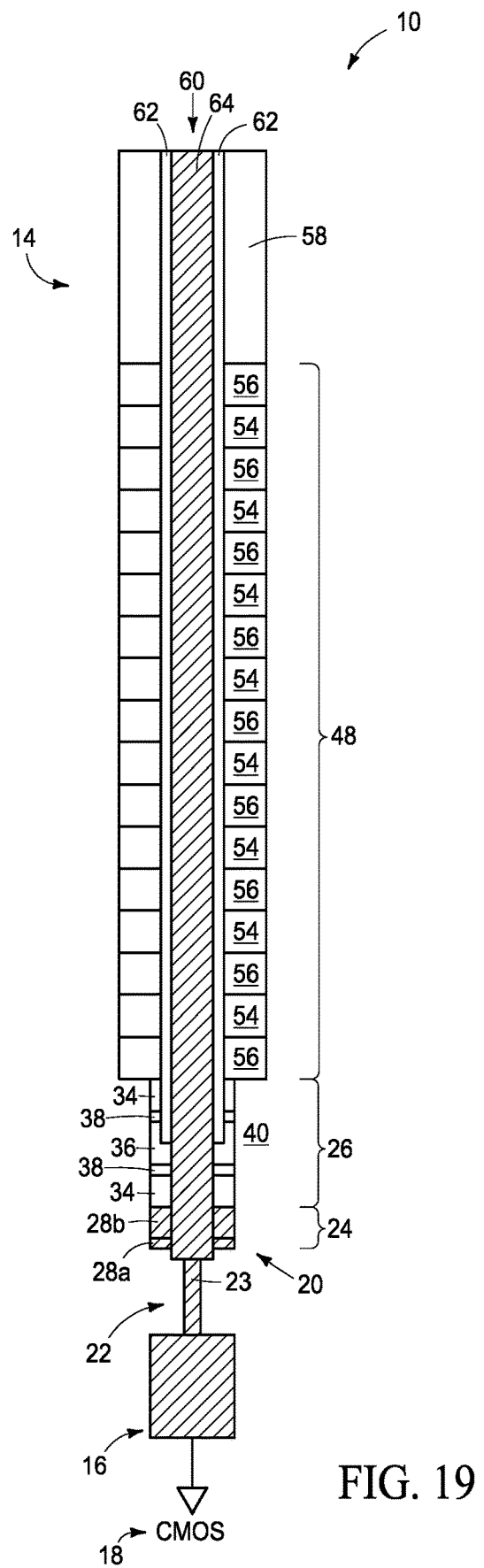

Referring to FIG. 19, the conductive material 64 is formed within the opening 60 with processing analogous to that described above with reference to FIG. 11. Subsequently, the assembly of FIG. 19 may be subjected to processing analogous to that described above with reference to FIGS. 12-15 to form a configuration similar to that described above with reference to FIG. 15.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory array region and another region proximate the memory array region. Conductive structures are distributed along a level within the memory array region and the other region. The conductive structures include a metal-containing region and a first stack over the metal-containing region. The first stack includes alternating semiconductor-material-containing regions and intervening regions. One of the semiconductor-material-containing regions is a central semiconductor-material-containing region and is vertically between two others of the semiconductor-material-containing regions. A second stack is over the level and is over the conductive structures. The second stack includes alternating first and second tiers. The first tiers include conductive material, and the second tiers include insulative material. Cell-material-pillars are within the memory array region. The cell-material-pillars extend through the second stack and into the first stack. The cell-material-pillars include channel material and include other materials laterally outward of the channel material. The central semiconductor material penetrates laterally through the other materials and directly contacts the channel material. Conductive post structures are within the other region. The conductive post structures extend through the second stack and through the conductive structures. Some of the conductive post structures are dummy structures and have bottom surfaces which are entirely along an insulative oxide material, and others of the conductive post structures are live structures and are electrically coupled with CMOS circuitry beneath the level.

Some embodiments include a method of forming an assembly. A construction is formed to comprise structures distributed along a level. A first set of the structures is over metal-containing interconnects, and a second set of the structures is only over an insulative oxide. The structures each include a metal-containing region and a first stack over the metal-containing region. The first stack includes a central region between two outer regions, with the central region being spaced from the outer regions by intervening regions. The central region comprises a first sacrificial material. A stack of alternating first and second tiers is formed over the structures. The first tiers comprise a second sacrificial material and the second tiers comprise a first insulative material. Openings are formed to extend through the stack and into the structures. The openings are lined with a second insulative material. Bottoms of the lined openings are punched through with etching conditions that utilize one or more halides. After punching through the bottoms of the lined openings, conductive post material is formed within the lined openings. The conductive post material within the first set of the structures is directly against the metal-containing interconnects and comprises a same composition as the metal-containing interconnects. The first sacrificial material is removed to form void regions. Semiconductor material is formed within the void regions. At least some of the second sacrificial material is replaced with conductive wordline material.

Some embodiments include a method of forming an assembly. A construction is formed to have a memory array region and another region proximate the memory array region. The construction includes structures within the memory array region and the other region. The structures include a metal-containing region and a first stack over the metal-containing region. The first stack includes a central region between two outer regions, includes a first intervening region between the central region and one of the outer regions, and includes a second intervening region between the central region and the other of the outer regions. The central region comprises a first sacrificial material. A first set of the structures within the other region are over metal-containing interconnects and a second set of the structures within the other region are only over an insulative oxide. A stack of alternating first and second tiers is formed over the structures. The first tiers comprise a second sacrificial material and the second tiers comprise a first insulative material. Openings are formed to extend through the stack and into the conductive structures within the other region. The openings are lined with a second insulative material. Bottoms of the lined openings are punched through utilizing etching conditions that slow upon reaching the insulative oxide and the metal-containing interconnects. After the punching through the bottoms of the lined openings, conductive post material is formed within the lined openings. Cell-material-pillars are formed within the memory array region. The cell-material-pillars extend through the second stack and into the first stack. The cell-material-pillars include channel material and other materials laterally outward of the channel material. The first sacrificial material is removed to form void regions. The void regions are extended laterally through the other materials to expose the channel material. Doped semiconductor material is formed within the void regions. At least some of the second sacrificial material is replaced with conductive wordline material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a memory array region and another region proximate the memory array region;
   conductive structures distributed along a level within the memory array region and the another region; the conductive structures including a metal-containing region and a first stack over the metal-containing region; the first stack including alternating semiconductor-material-containing regions and intervening regions; one of the semiconductor-material-containing regions being a central semiconductor-material-containing region and being vertically between two others of the semiconductor-material-containing regions;
   a second stack over the level and over the conductive structures; the second stack comprising alternating first and second tiers; the first tiers comprising conductive material and the second tiers comprising insulative material;
   cell-material-pillars within the memory array region; the cell-material-pillars extending through the second stack and into the first stack; the cell-material-pillars including channel material and including other materials laterally outward of the channel material; the central semiconductor material penetrating laterally through the other materials and directly contacting the channel material; and
   conductive post structures within the another region; the conductive post structures extending through the second stack and through the conductive structures; some of the conductive post structures being dummy structures and having bottom surfaces which are entirely along an insulative oxide material, and others of the conductive post structures being live structures and being electrically coupled with CMOS circuitry which is beneath the level.

2. The integrated assembly of claim 1 wherein the metal-containing region includes WSi, where the chemical formula indicates primary constituents rather than a specific stoichiometry.

3. The integrated assembly of claim 2 wherein the metal-containing region includes metal-containing material under the WSi; and wherein said metal-containing material includes one or both of TiN and WN, where the chemical formulas indicate primary constituents rather than specific stoichiometries.

4. The integrated assembly of claim 1 wherein one of the conductive structures is within the memory array region and is configured as a source structure.

5. The integrated assembly of claim 1 wherein the conductive post structures comprise tungsten.

6. The integrated assembly of claim 1 wherein the conductive post structures consist essentially of tungsten.

7. The integrated assembly of claim 1 wherein the central semiconductor-material-containing region comprises doped silicon.

8. The integrated assembly of claim 7 wherein the others of the semiconductor-material-containing regions comprise doped silicon.

9. The integrated assembly of claim 8 wherein the intervening regions comprise conductive material.

10. The integrated assembly of claim 8 wherein the intervening regions comprise insulative material.

11. The integrated assembly of claim 1 wherein the first tiers are NAND wordline tiers.

12. The integrated assembly of claim 11 wherein the NAND wordline tiers include metal, and wherein the insulative material of the second tiers includes silicon dioxide.

13. The integrated assembly of claim 1 wherein the another region includes a staircase region and a crest region adjacent to the staircase region; wherein the dummy structures are within the staircase region; and wherein the live structures are within the crest region.

14. The integrated assembly of claim 1 wherein the conductive post structures extend entirely through the conductive structures.

15. The integrated assembly of claim 1 wherein the metal-containing region comprises two separate and discrete layers.

16. The integrated assembly of claim 15 wherein the two separate and discrete layers are each conductive layers.

17. The integrated assembly of claim 15 wherein the two separate and discrete layers each have a metal as the only composition.

18. The integrated assembly of claim 1 wherein the intervening regions are conductive material.

19. The integrated assembly of claim 1 wherein the first stack comprises a plurality of separate and discrete stack structures extending from the second stack.

20. The integrated assembly of claim 1 wherein the first stack comprises a plurality of separate and discrete stack structures in the another region extending from the second stack.

21. The integrated assembly of claim 1 wherein at least one of the intervening regions contacts the central semiconductor material that penetrates laterally through the other materials and directly contacts the channel material.

22. The integrated assembly of claim 1 wherein at least two of the intervening regions contact the central semiconductor material that penetrates laterally through the other materials and directly contacts the channel material.

23. The integrated assembly of claim 1 wherein the conductive structures comprise a bottommost surface and wherein the conductive post structures extend through the bottommost surface of the conductive structures.

24. The integrated assembly of claim 1 further comprising conductive interconnects extending from a bottommost surface of the conductive post structures.

25. The integrated assembly of claim 24 wherein the conductive interconnects comprise a first lateral width along a cross-section, and wherein the conductive post structures comprise a second lateral width along the cross-section which is about the same as the first lateral width.

26. The integrated assembly of claim 1 wherein the central semiconductor material comprises one or more of silicon, germanium, III/V semiconductor material and semiconductor oxide.

27. The integrated assembly of claim 1 wherein the central semiconductor material is heavily doped to a concentration of at least about $10^{22}$ atoms/cm$^3$.

28. The integrated assembly of claim 1 wherein the central semiconductor material is configured as a source-structure-component.

* * * * *